(12) United States Patent
Danielson et al.

(10) Patent No.: US 12,457,701 B2
(45) Date of Patent: Oct. 28, 2025

(54) MECHANICAL AND ELECTRICAL CONNECTION CLAMP

(71) Applicant: Advanced Energy Industries, Inc., Fort Collins, CO (US)

(72) Inventors: Jon Danielson, Fort Collins, CO (US); Courtney Crandell, Fort Collins, CO (US); Michael Shover, Bellvue, CO (US); Steven Lawless, Loveland, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 679 days.

(21) Appl. No.: 17/493,941

(22) Filed: Oct. 5, 2021

(65) Prior Publication Data

US 2022/0115797 A1   Apr. 14, 2022

Related U.S. Application Data

(60) Provisional application No. 63/089,278, filed on Oct. 8, 2020.

(51) Int. Cl.
*H05K 7/20* (2006.01)
*H01R 4/28* (2006.01)
(Continued)

(52) U.S. Cl.
CPC ............... *H05K 7/12* (2013.01); *H01R 4/28* (2013.01); *H01R 12/7047* (2013.01); *H05K 7/14329* (2022.08); *H05K 7/2039* (2013.01)

(58) Field of Classification Search
CPC ... H05K 5/0017; H05K 5/0217; H05K 7/2039
(Continued)

(56) References Cited

U.S. PATENT DOCUMENTS

| | | | | |
|---|---|---|---|---|
| 4,164,003 | A * | 8/1979 | Cutchaw | H01L 23/4006 361/783 |
| 4,417,095 | A * | 11/1983 | Beun | H05K 3/301 174/559 |
| 6,750,551 | B1 * | 6/2004 | Frutschy | F16L 41/08 257/713 |

(Continued)

FOREIGN PATENT DOCUMENTS

| | | |
|---|---|---|
| CN | 201290200 Y | 8/2009 |
| CN | 211047393 U | 7/2020 |

(Continued)

OTHER PUBLICATIONS

International Search Report and Written Opinion received for International PCT Application Serial No. PCT/US2021/053599 dated Jan. 27, 2022, 6 pages.

(Continued)

*Primary Examiner* — Hung S. Bui
(74) *Attorney, Agent, or Firm* — NOD Law PC

(57) ABSTRACT

A connection clamp assembly and an electrical system including a connection clamp assembly are disclosed. The connection clamp assembly includes a rigid clamp portion with one or more protrusions configured to mechanically secure one or more electrical leads of an electronic device to one or more electrical connection points on a printed circuit board assembly forming an electrical connection. One or more fasteners pass through the rigid clamp portion and are configured to couple the connection clamp assembly to the printed circuit board assembly. A lid elastic element is received by the rigid clamp portion and is configured to elastically press on the electronic device, mechanically and thermally coupling the electronic device to the printed circuit board assembly.

18 Claims, 7 Drawing Sheets

(51) Int. Cl.
*H01R 12/70* (2011.01)
*H05K 7/12* (2006.01)
*H05K 7/14* (2006.01)

(58) Field of Classification Search
USPC ......................................................... 361/810
See application file for complete search history.

(56) References Cited

U.S. PATENT DOCUMENTS

| | | | | |
|---|---|---|---|---|
| 7,885,080 | B2* | 2/2011 | Janisch | H05K 5/0047 |
| | | | | 361/757 |
| 2005/0161807 | A1 | 7/2005 | Gonzalez et al. | |
| 2007/0149025 | A1* | 6/2007 | Mori | H05K 3/325 |
| | | | | 439/331 |
| 2012/0014155 | A1* | 1/2012 | Hashimoto | H01L 25/16 |
| | | | | 363/147 |
| 2013/0017721 | A1* | 1/2013 | Mason | H01R 13/6585 |
| | | | | 439/607.08 |
| 2015/0077940 | A1* | 3/2015 | Rapisarda | H05K 1/181 |
| | | | | 361/702 |
| 2016/0104631 | A1* | 4/2016 | Guth | H01L 23/49811 |
| | | | | 361/728 |
| 2016/0351526 | A1* | 12/2016 | Boyd | H01L 24/75 |

FOREIGN PATENT DOCUMENTS

| | | |
|---|---|---|
| JP | 2011-060710 A | 3/2011 |
| KR | 10-2015-0006361 A | 1/2015 |

OTHER PUBLICATIONS

TIPO, Examination Report issued in Taiwan Patent Application No. 110137576, Apr. 16, 2025, 11 pages.

\* cited by examiner

MECHANICAL AND ELECTRICAL CONNECTION CLAMP

CLAIM OF PRIORITY UNDER 35 U.S.C. § 119

The present application for patent claims priority to Provisional Application No. 63/089,278 entitled "MECHANICAL AND ELECTRICAL CONNECTION CLAMP" filed Oct. 8, 2020 and assigned to the assignee hereof and hereby expressly incorporated by reference herein.

BACKGROUND

Field

The present disclosed embodiments relate generally to electronic component connectors, and more specifically to clamping devices that provide for a mechanical and electrical connection between electronic components.

Background

Many electronic components and devices are designed to be mechanically, electrically, and thermally coupled with a printed circuit board (PCB) and its associated cooling system. For example, some MOSFETs are packaged in electronic devices that are designed to be mounted directly to a cooling device associated with a PCB assembly (PCBA) and to connect to the PCB via short electrical connections, or leads, that are often soldered in place. However, manufacturers have shown that mounting such packaged MOSFETs by directly screwing the device down by its ends fails to form an adequate thermal bond line in some cases. Additionally, the solder connections of the electrical leads are vulnerable to fatigue and failure due to thermal cycling, particularly if lead-free solder is used. In applications and devices that experience significant thermal cycling, such as an RF generator, this solder fatigue and failure may be especially problematic.

There is therefore a need in the art for a new device that addresses the specific mounting and electrical connection issues mentioned above and that enables reliable mechanical, electrical, and thermal connections to be made between an electronic device, such as a packaged MOSFET, and a PCBA.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some aspects of the present disclosure may be characterized as a connection clamp assembly that includes a rigid clamp portion with one or more protrusions configured to mechanically secure one or more electrical leads of an electronic device to one or more electrical connection points on a printed circuit board assembly forming an electrical connection. The connection clamp assembly may further include one or more fasteners passing through the rigid clamp portion, the fasteners configured to couple the connection clamp assembly to the printed circuit board assembly, and a lid elastic element received by the rigid clamp portion, the lid elastic element configured to elastically press on the electronic device, mechanically and thermally coupling the electronic device to the printed circuit board assembly.

Other aspects of the present disclosure may be characterized as a connection clamp assembly that includes a rigid clamp portion including means for mechanically securing one or more electrical leads of an electronic device to one or more electrical connection points on a printed circuit board assembly forming an electrical connection. The connection clamp assembly may further include one or more fasteners passing through the rigid clamp portion, the fasteners configured to couple the connection clamp assembly to the printed circuit board assembly, and means for mechanically and thermally coupling the electronic device to the printed circuit board assembly.

Other aspects of the present disclosure may be characterized as an electronic system that includes a printed circuit board assembly, an electronic device configured to be mechanically, electrically, and thermally coupled to the printed circuit board assembly, and a connection clamp assembly. The connection clamp assembly may include a rigid clamp portion with one or more protrusions configured to mechanically secure one or more electrical leads of the electronic device to one or more electrical connection points on the printed circuit board assembly forming an electrical connection. The connection clamp assembly may further include one or more fasteners passing through the rigid clamp portion, the fasteners configured to couple the connection clamp assembly to the printed circuit board assembly, and a lid elastic element received by the rigid clamp portion, the lid elastic element configured to elastically press on the electronic device, mechanically and thermally coupling the electronic device to the printed circuit board assembly.

DETAILED DESCRIPTION

Figure 1:
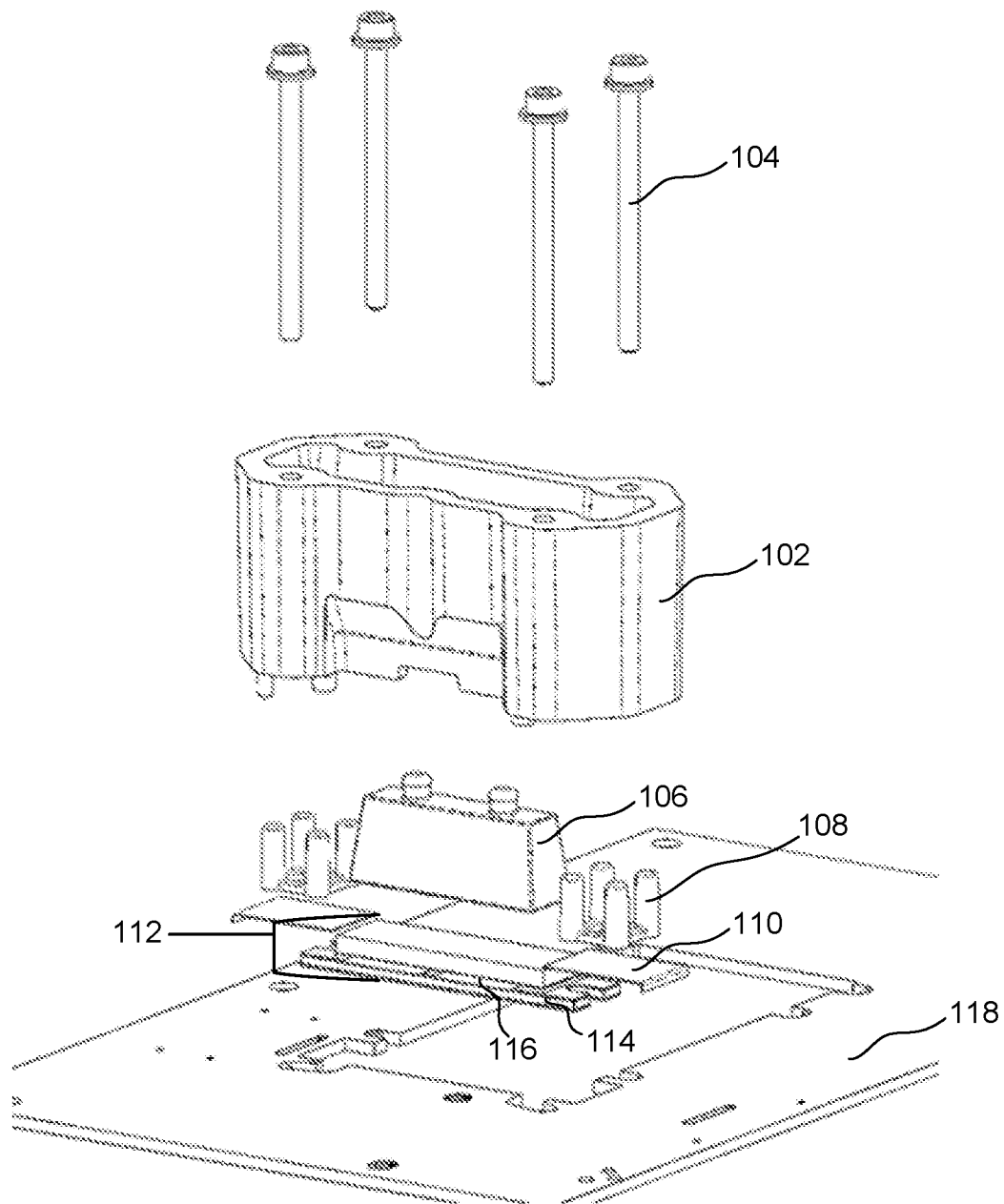
FIG. 1 illustrates an exemplary embodiment of a connection clamp assembly in accordance with the embodiments described herein.

The word "exemplary" is used herein to mean "serving as an example, instance, or illustration." Any embodiment described herein as "exemplary" is not necessarily to be construed as preferred or advantageous over other embodiments.

The present disclosure may enable simultaneous mechanical, electrical, and thermal connections to be reliably made between an electronic device and a printed circuit board assembly (PCBA) with its associated cooling system. Additionally, the present disclosure may enable additional electrical connections to be made between the electronic device and the PCBA beyond just the electrical leads associated with the electronic device. Furthermore, the present disclosure may enable a more optimal thermal coupling alignment between the electronic device and the cooling system associated with the PCBA. By implementing the apparatuses of the present disclosure, significant improvements in the mechanical, electrical, and thermal connections of electronic devices may be obtained and potentially improve overall reliability and functionality, especially in applications with significant thermal cycling.

In some embodiments, the present disclosure may comprise a connection clamp assembly with a rigid clamp portion and lid elastic element configured to mechanically, electrically, and thermally couple an electronic device to a PCBA. The rigid clamp portion may be constructed of a rigid, insulating material, such as plastic, and be configured to make electrical connections between the electronic device and PCBA by securing one or more electrical leads of the electronic device to one or more electrical connection points on the PCBA. For example, the electronic device may be a packaged MOSFET whose electrical leads are pressed into electrical connection points on the PCBA by protrusions of the rigid clamp portion to form an electrical connection between the MOSFET and PCBA. Such electrical connections made by the rigid clamp portion may enable greater electrical connection reliability, especially in comparison to solder connections and in applications with significant thermal cycling.

The rigid clamp portion may also be configured to receive the lid elastic element and compress the lid elastic element against the electronic device when the connection clamp assembly is mechanically coupled to the PCBA. The lid elastic element may be configured to elastically press on the electronic device and mechanically secure it in place, such as adjacent to an element of a cooling system associated with the PCBA. For example, the mechanical force provided by the lid elastic element may provide the bond line pressure needed to establish an optimal thermal connection between the electronic device and an element of a cooling system. The lid elastic element may comprise an element that exerts a restoring force when compressed, such as rubber or other elastomeric material, metallic springs, or a combination thereof. Such a lid elastic element may enable the electronic device to be mechanically and thermally coupled to the PCBA. Additionally, the elasticity and deformability of such a lid elastic element may enable a wider geometric tolerance range in the clamp assembly and the electronic component while providing such a mechanical and thermal coupling.

The connection clamp assembly may be coupled to the PCBA via fasteners, such as screws, that pass through the rigid clamp portion and are offset from the centerline of the electronic device. Offsetting the fasteners from the centerline of the electronic device may enable other components and systems associated with the PCBA, such as a cooling system, to easily access and align with the central portion of the electronic device without the interference of protruding fasteners.

In some embodiments, the connection clamp assembly may further comprise one or more baseplate elastic elements and one or more baseplate electrical connectors. The baseplate electrical connectors may be constructed of a conductive material and may be configured to electrically couple with a baseplate of the electronic device, such as a baseplate of a MOSFET, as well as one or more electrical connection points of the PCBA. The baseplate elastic elements may be received by the rigid clamp portion and may be configured to elastically press on the baseplate electrical connectors, mechanically securing the baseplate electrical connectors in place. The baseplate elastic elements may each comprise an element that exerts a restoring force when compressed, such as rubber or other elastomeric material, metallic springs, or a combination thereof. The baseplate elastic elements and baseplate electrical connectors may enable additional electrical connections to be made between the electronic device and the PCBA beyond just the electrical leads associated with the electronic device. Such additional electrical connections may improve the overall functionality of the electronic device. For example, if the electronic device is a packaged MOSFET that has been connected via its baseplate to a cooling system of the PCBA with a non-electrical conducting thermal interface material, such as thermal grease, some of the electrical connectivity of the MOSFET may be inhibited, such as a source to ground path passing through the baseplate. In such a case, the additional electrical connections may be used to supplement the inhibited electrical connections, such as by providing an alternative source to ground path through the PCBA.

Referring now to the drawings, FIG. 1 illustrates an exemplary embodiment of a connection clamp assembly. The connection clamp assembly may comprise a rigid clamp portion 102, one or more fasteners 104, and a lid elastic element 106. Optionally, the connection clamp assembly may further comprise one or more baseplate elastic elements 108 and one or more baseplate electrical connectors 110. The connection clamp assembly may be configured to mechanically, electrically, and thermally couple an electronic device 112, which may comprise a baseplate 114 and one or more electrical leads 116, to a PCBA 118. The rigid clamp portion 102 may be constructed of a rigid, insulating material, such as plastic, and be configured to make electrical connections between the electronic device 112 and PCBA 118 by securing one or more of the electrical leads 116 of the electronic device 112 to one or more electrical connection points on the PCBA 118. The rigid clamp portion 102 may electrically couple one or more of the electrical leads 116 to one or more of the electrical connection points on the PCBA 118 using protrusions that extend downward from the bottom surface of the rigid clamp portion 102. When the fasteners 104 are tightened, the protrusions of the rigid clamp portion 102 may be configured to hold one or more of the electrical leads 116 against one or more of the electrical connection points on the PCBA 118, providing a means for mechanically securing the electrical leads 116 of the electronic device 112 to the electrical connection points on the PCBA 118 forming an electrical connection. For example, the electronic device 112 may be a packaged MOSFET whose electrical leads 116, such as those associated with a gate, source, or drain, may be pressed into electrical connection points on the PCBA 118 by protrusions of the rigid clamp portion 102 to form an electrical connection between the electronic device 112 and PCBA 118. Such solder-free electrical connections made by the rigid clamp portion 102 may enable greater electrical connection reliability, particularly in applications with significant thermal cycling.

The rigid clamp portion 102 may also be configured to receive the lid elastic element 106 in a central recess in the bottom surface of the rigid clamp portion 102 and compress the lid elastic element 106 against the electronic device 112 when the connection clamp assembly is mechanically coupled to the PCBA 118. The lid elastic element 106 may comprise one or more vertical protrusions extending upward and configured to be received by one or more holes within the central recess in the bottom surface of the rigid clamp portion 102. The lid elastic element 106 may be configured to elastically press on the electronic device 112 and mechanically secure it in place, such as adjacent to an element of a cooling system associated with the PCBA 118, providing a means for mechanically and thermally coupling the electronic device 112 to the PCBA 118. The lid elastic element 106 may deform and provide adequate pressure to the top of the electronic device 112 within the tolerance pressure of the electronic device 112 when the fasteners 104 are fully tightened and the rigid clamp portion 102 is held in place. The lid elastic element 106 may comprise an element that exerts a restoring force when compressed, such as rubber or other elastomeric material, metallic springs, or a combination thereof. Such a lid elastic element 106 may enable the electronic device 112 to be mechanically and thermally coupled to the PCBA 118.

The fasteners 104 may couple the connection clamp assembly to the PCBA 118 and may pass through holes in the perimeter of the rigid clamp portion 102, offset from the centerline of the electronic device 112. Offsetting the fasteners 104 from the centerline of the electronic device 112 may enable other components and systems associated with the PCBA 118, such as a cooling system, to easily access the central portion of the electronic device 112 without the interference of protruding fasteners 104.

The baseplate electrical connectors 110 may be constructed of a conductive material and may be configured to electrically couple with a baseplate 114 of the electronic device 112, such as a MOSFET, as well as one or more electrical connection points of the PCBA 118. The baseplate elastic elements 108 may be received by one or more non-central recesses in the bottom surface of the rigid clamp portion 102 and may be configured to deform and elastically press on the baseplate electrical connectors 110, mechanically securing the baseplate electrical connectors 110 in place. For example, the baseplate elastic elements 108 may mechanically secure the baseplate electrical connectors 110 to both the baseplate 114 and the electrical connection points of the PCBA 118, forming an electrical connection and providing a means for electrically coupling the baseplate 114 of the electronic device 112 to the electrical connection points of the PCBA 118. The baseplate elastic elements 108 may each comprise an element that exerts a restoring force when compressed, such as rubber or other elastomeric material, metallic springs, or a combination thereof. The baseplate elastic elements 108 and baseplate electrical connectors 110 may enable additional electrical connections to be made between the electronic device 112 and the PCBA 118 beyond just the electrical leads 116 associated with the electronic device 112. Such additional electrical connections may improve the overall functionality of the electronic device 112. For example, if the electronic device 112 is a packaged MOSFET that has been connected via its baseplate 114 to a cooling system of the PCBA 118 with a non-electrical conducting thermal interface material, such as thermal grease, some of the electrical connectivity of the electronic device 112 may be inhibited, such as a source to ground path passing through the baseplate 114. In such a case, the additional electrical connections may be used to supplement the inhibited electrical connections, such as by providing an alternative source to ground path through the PCBA 118.

Figure 2A:
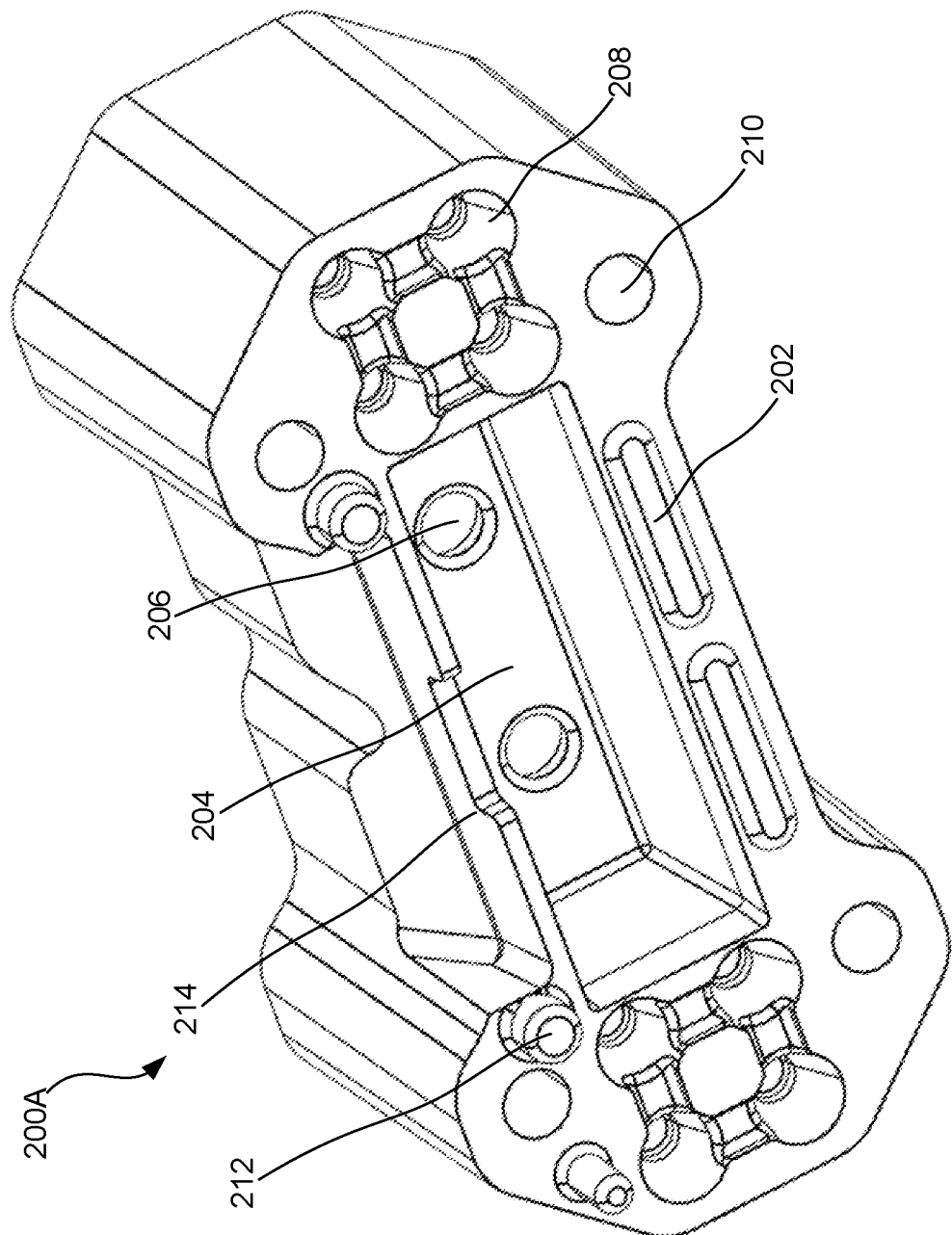
FIG. 2A illustrates a bottom-up view of an exemplary embodiment of a rigid clamp portion of a connection clamp assembly in accordance with the embodiments described herein.

FIG. 2A illustrates a bottom-up view of an exemplary embodiment of a rigid clamp portion 200A of a connection clamp assembly, such as the connection clamp assembly of FIG. 1. The rigid clamp portion 200A may be constructed of a rigid, insulating material, such as plastic, and be configured to electrically couple an electronic device and a PCBA utilizing one or more protrusions 202 extending downward from the bottom surface of the rigid clamp portion 200A that may mechanically secure one or more electrical leads of the electronic device to one or more electrical connection points of the PCBA when the connection clamp assembly is mechanically coupled to the PCBA. Such solder-free electrical couplings made by the rigid clamp portion 200A may enable greater electrical connection reliability, particularly in applications with significant thermal cycling.

In other embodiments, the rigid clamp portion 200A may be constructed of a rigid, conducting material, such as a metal, and the one or more protrusions 202 may be constructed of a rigid insulating material, such as plastic. Such a configuration may enable the main body of the rigid clamp portion 200A to, for example, provide some thermal conductivity functionality, which may be utilized by a cooling system of the PCBA.

The rigid clamp portion 200A may also comprise a central recess 204 in its bottom surface with one or more central recess holes 206 configured to receive a lid elastic element with one or more vertical protrusions. The rigid clamp portion 200A may be configured to compress the lid elastic element seated in the central recess 204 against the electronic device when the connection clamp assembly is mechanically coupled to the PCBA. The rigid clamp portion 200A may further comprise one or more non-central recesses 208 in the bottom surface of the rigid clamp portion 200A that may each comprise one or more cylindrical recesses and each be configured to receive a baseplate elastic element. The rigid clamp portion 200A may be configured to compress each baseplate elastic element seated in each non-central recess 208 against a baseplate electrical connector when the connection clamp assembly is mechanically coupled to the PCBA. The rigid clamp portion 200A may further comprise one or more perimeter holes 210 along the perimeter of the rigid clamp portion 200A and offset from the centerline of the electronic device. The perimeter holes 210 may be configured to receive one or more fasteners, such as screws, that may secure the rigid clamp portion 200A to the PCBA. Offsetting the perimeter holes 210 and fasteners from the centerline of the electronic device may enable a greater ease of access to the central portions of the electronic device as stated above. The rigid clamp portion 200A may further comprise one or more hard stops 212 extending downward from the bottom surface of the rigid clamp portion 200A. The one or more hard stops 212 may interface with the PCBA and enable the rigid clamp portion 200A to maintain proper alignment when the connection clamp assembly is mechanically coupled to the PCBA. The rigid clamp portion may further comprise a side recess 214 that extends into a lower portion of a side wall of the rigid clamp portion 200A. Such a side recess 214 may enable other connection clamp assemblies or components associated with the PCBA to access the electronic device as well as the one or more electrical leads of the electronic device.

Figure 2B:
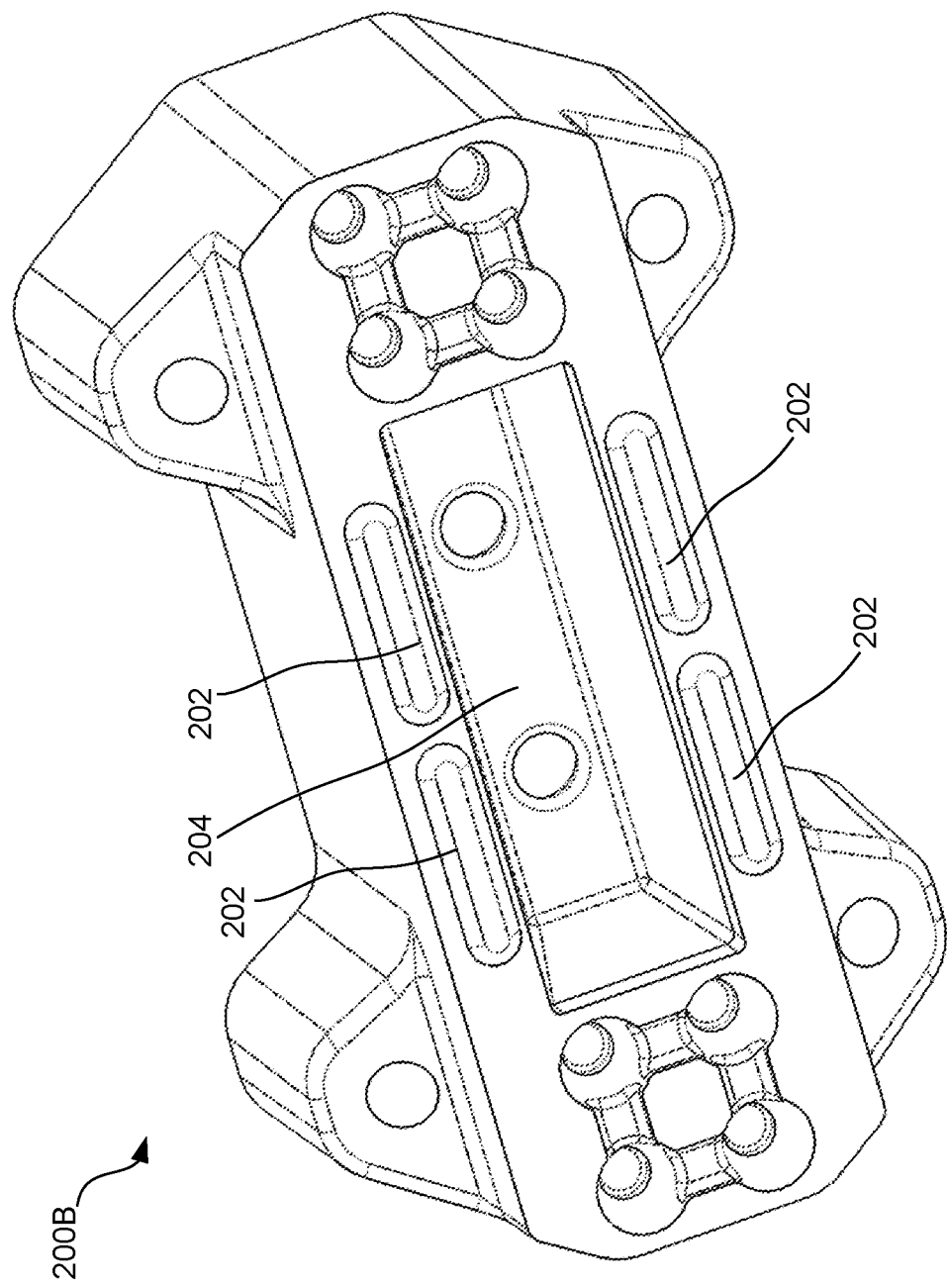
FIG. 2B illustrates a bottom-up view of another exemplary embodiment of a rigid clamp portion of a connection clamp assembly.

In other embodiments, as shown in FIG. 2B, a rigid clamp portion 200B may comprise one or more protrusions 202 extending downward from the bottom surface of the rigid clamp portion 200B on both sides of the central recess 204. For example, the rigid clamp portion 200B may comprise two protrusions 202 on each side of the central recess 204 configured to mechanically secure all of the electrical leads of a four-lead electronic device to electrical connection points of the PCBA when the connection clamp assembly is mechanically coupled to the PCBA. In such an example, the rigid clamp portion 200B may potentially omit the one or more hard stops 212 (shown in FIG. 2A) as the alignment functionality of the rigid clamp portion 200A may instead be enabled by the protrusions 202 on both sides of the central recess 204. Additionally, in such an example, the rigid clamp portion 200B may potentially omit the side recess 214 (as shown in FIG. 2B), particularly in applications where access to the electronic device is not necessary with all of the electrical leads of the electronic device mechanically secure to electrical connection points of the PCBA.

Figure 3:
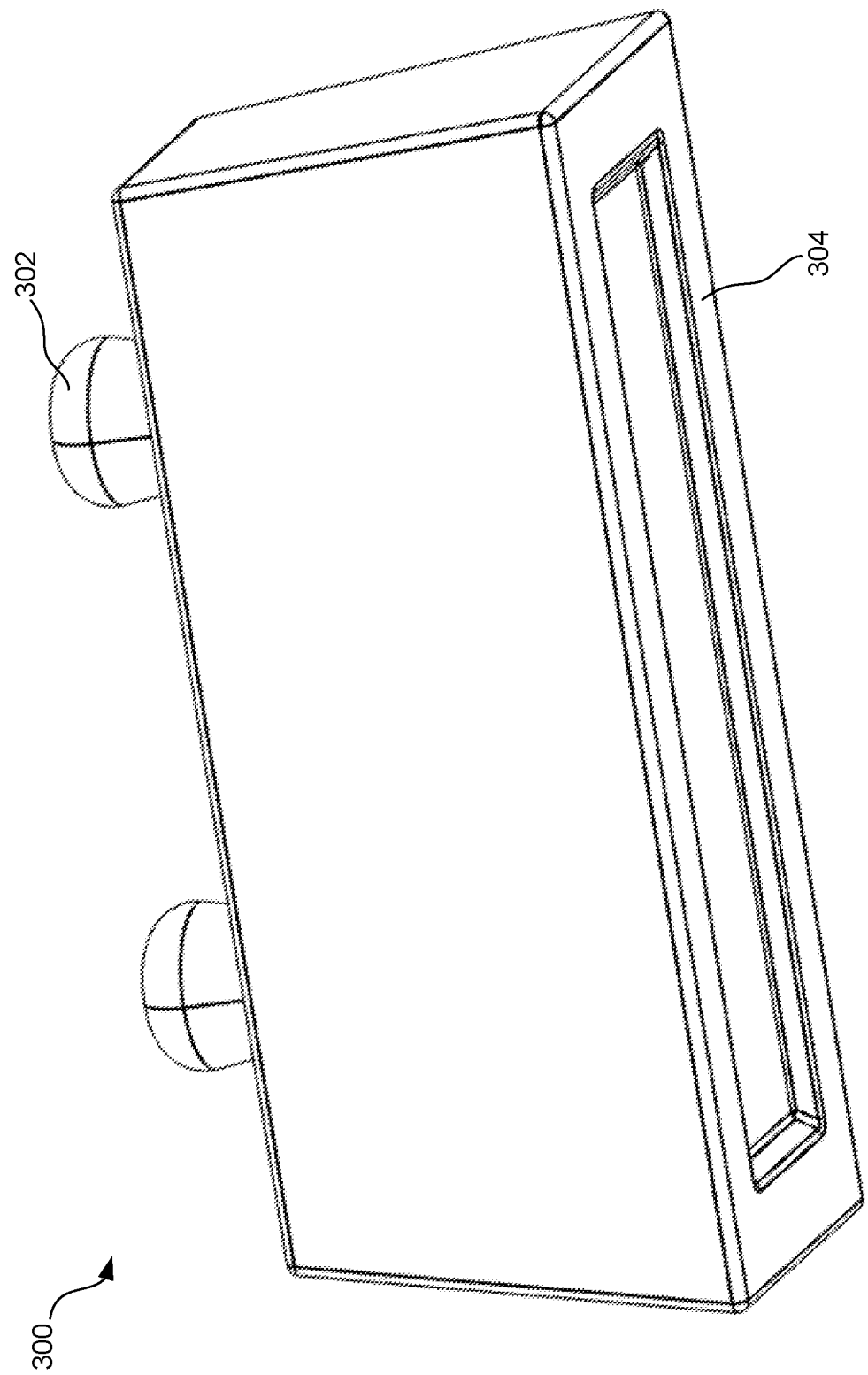
FIG. 3 illustrates a lid elastic element of an exemplary embodiment of a connection clamp assembly in accordance with the embodiments described herein.

FIG. 3 illustrates a lid elastic element 300 of an exemplary embodiment of a connection clamp assembly, such as the connection clamp assembly of FIG. 1. The lid elastic element 300 may comprise one or more vertical protrusions 302 extending upward and configured to be received by one or more central recess holes within a central recess in the bottom surface of a rigid clamp portion. The lid elastic element 300 may have a roughly trapezoidal prism shape and may also comprise a raised lip 304 along the perimeter of its bottom surface. But other shapes and geometries are certainly contemplated.

The raised lip 304 may be configured to directly interface with an electronic device to elastically press on the electronic device and mechanically secure it in place, such as adjacent to an element of a cooling system associated with a PCBA. The lid elastic element 300 and the raised lip 304 may deform and provide adequate pressure to the top of the electronic device within the tolerance pressure of the electronic device when the connection clamp assembly is mechanically coupled to the PCBA. The lid elastic element 300 may comprise an element that exerts a restoring force when compressed, such as rubber or other elastomeric material, metallic springs, or a combination thereof. Such a lid elastic element 300 may enable the electronic device to be mechanically and thermally coupled to the PCBA as stated above. The raised lip 304 of the lid elastic element 300 may enable the pressure applied to the top of the electronic device to be directed towards the perimeter of the electronic device, potentially reducing the mechanical stress placed on components of the electrical device.

For example, applying pressure to the perimeter of a MOSFET lid rather than the central portion may reduce the risk of cracking or damaging the MOSFET lid. Additionally, the raised lip 304 of the lid elastic element 300 may enable improvements in the contact surface between the lid elastic element 300 and electronic devices with certain top surface geometries, such as those with a raised central portion. Furthermore, the raised lip 304 may enable tuning of the lid elastic element 300 deformation and force exerted on the electronic device when compressed by the rigid clamp portion based on the extension of the raised lip 304 while maintaining a low susceptibility to stress relaxation or creep.

Figure 4:
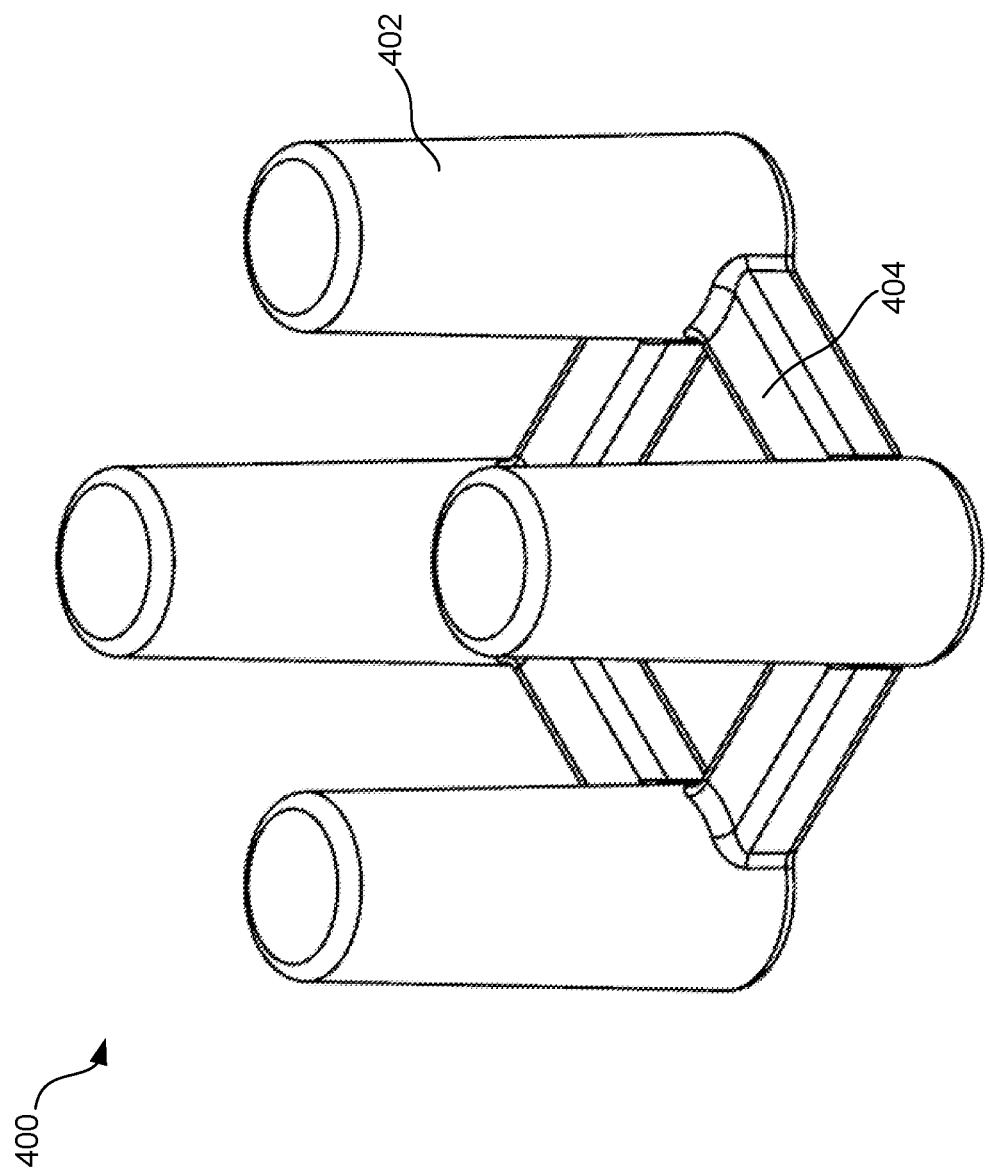
FIG. 4 illustrates a baseplate elastic element of an exemplary embodiment of a connection clamp assembly in accordance with the embodiments described herein.

FIG. 4 illustrates a baseplate elastic element 400 of an exemplary embodiment of a connection clamp assembly, such as the connection clamp assembly of FIG. 1. The baseplate elastic element 400 may comprise four cylindrical columns 402 extending from a roughly square base element 404. The baseplate elastic element 400 may be configured to be received by a non-central recess in the bottom surface of a rigid clamp portion of the connection clamp assembly. The rigid clamp portion may be configured to compress the cylindrical columns 402 of the baseplate elastic element 400 against a baseplate electrical connector when the connection clamp assembly is mechanically coupled to a PCBA. The baseplate elastic element 400 may be configured to deform and elastically press on the baseplate electrical connector with adequate pressure within the tolerance of the assembly, mechanically securing the baseplate electrical connector in place.

The baseplate elastic element 400 may comprise an element that exerts a restoring force when compressed, such as rubber or other elastomeric material, metallic springs, or a combination thereof. The baseplate elastic element 400 and baseplate electrical connector may enable additional electrical connections to be made between an electronic device and the PCBA as stated above. Varying the height and diameter of the cylindrical columns 402 may enable tuning of the baseplate elastic element 400 deformation and force exerted on the baseplate electrical connector when compressed by the rigid clamp portion while maintaining a low susceptibility to stress relaxation or creep. It should be recognized that the design depicted in FIG. 4 is one example and that many other designs that accomplish the same function.

Figure 5:
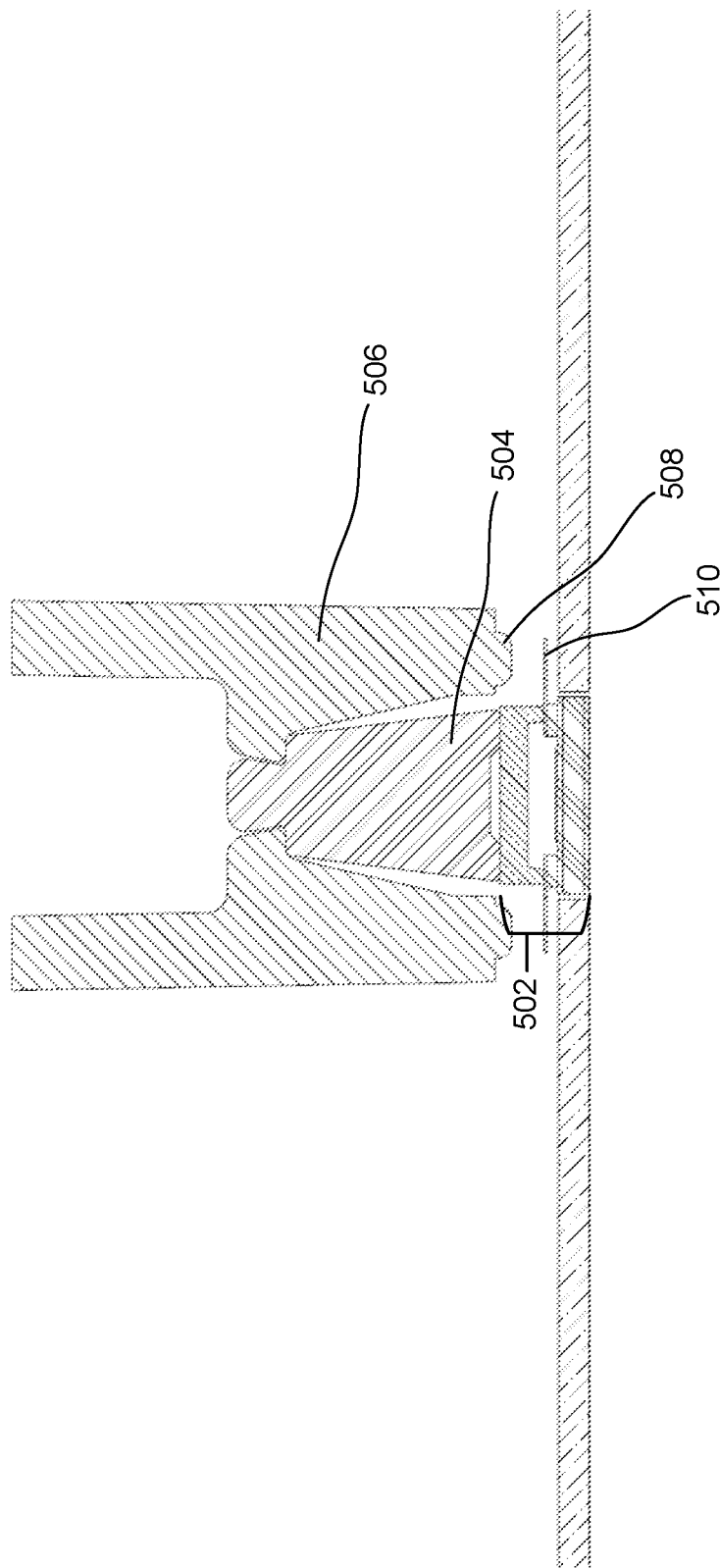
FIG. 5 illustrates a cross-sectional view of an exemplary embodiment of a connection clamp assembly interfacing with an electronic device in a non-fully compressed state in accordance with the embodiments described herein.

FIG. 5 illustrates a cross-sectional view of an exemplary embodiment of a connection clamp assembly, such as the connection clamp assembly of FIG. 1, interfacing with an electronic device 502 in a non-fully compressed state. A lid elastic element 504 may be compressed directly against the top surface of the electronic device 502 by a rigid clamp portion 506 when the connection clamp assembly is mechanically coupled to a PCBA, securing the electronic device 502 in place. A protrusion 508 extending downward from the bottom surface of the rigid clamp portion 506 may be configured to electrically couple the electronic device 502 and the PCBA by applying a force to an electrical lead 510 of the electronic device 502 that may mechanically secure the electrical lead 510 to an electrical connection point of the PCBA (not shown) when the connection clamp assembly is mechanically coupled to the PCBA and in a fully compressed state. Such solder-free electrical couplings made by the rigid clamp portion 506 may enable greater electrical connection reliability, particularly in applications with significant thermal cycling, as stated above.

Figure 6:
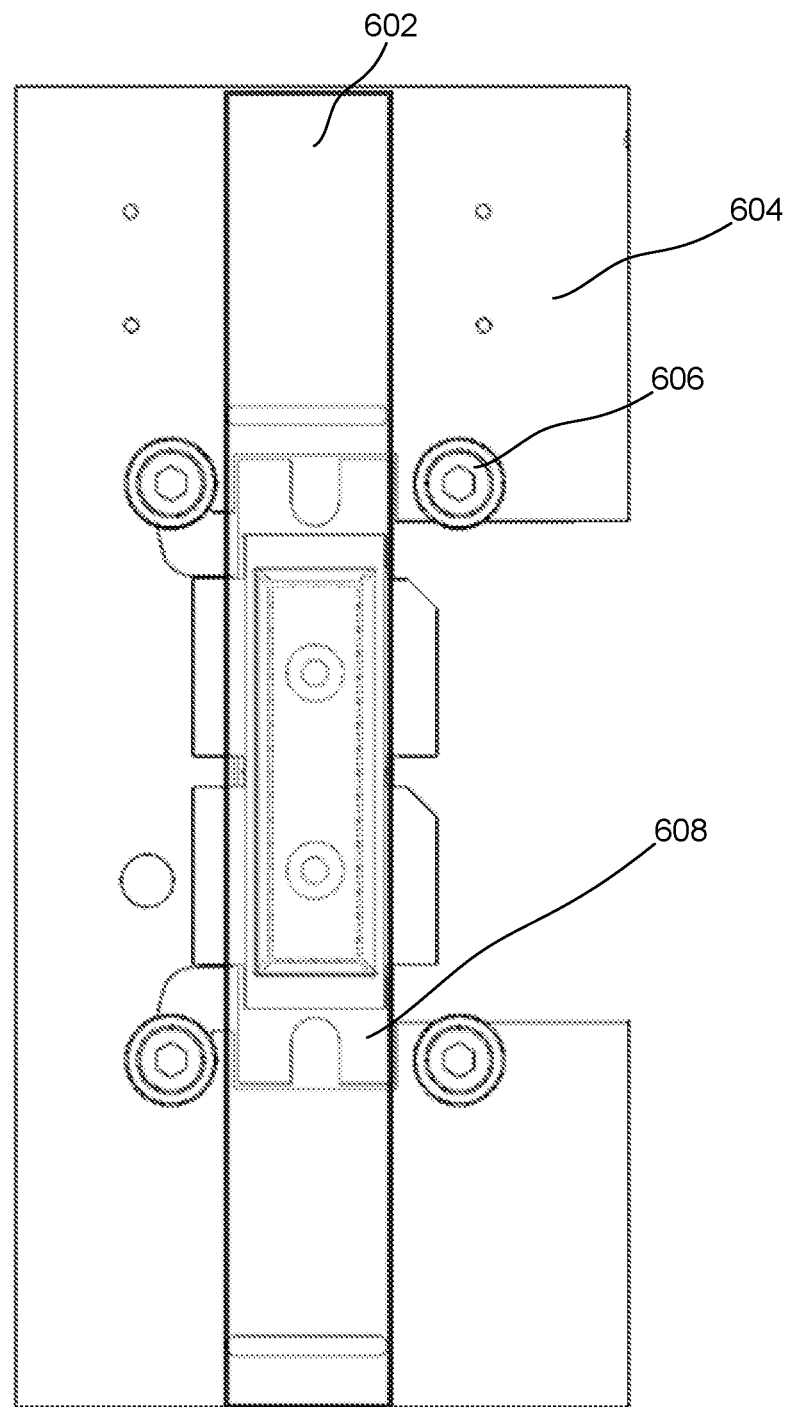
FIG. 6 illustrates a top-down view of an exemplary embodiment of a connection clamp assembly with a rigid clamp portion removed for clarity that aligns with a cooling path in accordance with the embodiments described herein.

FIG. 6 illustrates a top-down view of an exemplary embodiment of a connection clamp assembly, such as the connection clamp assembly of FIG. 1, with a rigid clamp portion removed for clarity that aligns with a cooling path 602 associated with a cooling system of a PCBA 604. One or more fasteners 606 may couple the connection clamp assembly to at least one of the PCBA 604 or the cooling system via holes in the perimeter of a rigid clamp portion (not shown) of the connection clamp assembly with the holes offset from the centerline of the electronic device 608 and the cooling path 602. The electronic device 608 may thermally couple with the cooling system via the cooling path 602, which may be positioned below the bottom surface of the electronic device 608. The cooling path 602 may comprise an element of the cooling system, such as a channel for fluid flow, a heat pipe, a vapor chamber, or another cooling system element known in the art to provide cooling. The offset holes and fasteners 606 may provide an unimpeded space that enables such a cooling path 602 to optimally align with and efficiently provide cooling to the entire bottom surface of the electronic device 608 without disruptions or diversions. Similarly, the positioning of the holes and fasteners 606 may enable other components and systems associated with the PCBA 604, such as a baseplate electrical connector as described above, to easily access the central portion of the electronic device 608 without the interference of protruding fasteners 606.

In some embodiments, the present disclosure may comprise an electronic system, such as a computing device, that includes a PCBA and an electronic device, such as a packaged MOSFET, configured to be mechanically, electrically, and thermally coupled to the PCBA. The electronic system may further include a connection clamp assembly, such as the connection clamp assembly of FIG. 1, that includes a rigid clamp portion with one or more protrusions configured to mechanically secure one or more electrical leads of the electronic device to one or more electrical connection points on the PCBA forming an electrical connection, which may be a solder-free electrical connection. The connection clamp assembly may further include one or more fasteners, such as screws, that pass through the rigid clamp portion and that are configured to couple the connection clamp assembly to the PCBA. The connection clamp assembly may further include a lid elastic element that may be received by the rigid clamp portion and configured to elastically press on the electronic device, mechanically and thermally coupling the electronic device to the PCBA, such as demonstrated in the exemplary embodiments of FIGS. 5 and 6.

Optionally, in some embodiments, the connection clamp assembly of the electronic system may further include one or more baseplate electrical connectors, such as the baseplate electrical connectors 110 of FIG. 1, that are configured to electrically couple a baseplate of the electronic device to the one or more electrical connection points of the PCBA. The connection clamp assembly may further include one or more baseplate elastic elements, such as the baseplate elastic elements 108 of FIG. 1, that are received by the rigid clamp portion and configured to elastically press on the baseplate electrical connectors, mechanically securing the baseplate electrical connectors to both the baseplate and the one or more electrical connection points of the PCBA. The baseplate elastic elements and baseplate electrical connectors may enable additional electrical connections to be made between the electronic device and the PCBA beyond just the electrical leads associated with the electronic device.

In some embodiments, the rigid clamp portion of the electronic system may include one or more hard stops, such as the hard stops 212 of FIG. 2A, that are configured to interface with the PCBA and align the rigid clamp portion properly, enabling the maintenance of proper alignment when the connection clamp assembly is mechanically coupled to the PCBA.

In some embodiments, the fasteners of the electronic system may pass through perimeter holes of the rigid clamp portion, and the connection clamp assembly may be configured to align with a cooling path associated with a cooling system of the PCBA, such as demonstrated in the exemplary embodiment of FIG. 6. Such an alignment of the connection clamp assembly may enable the electronic device to thermally couple with the cooling system via the cooling path, which may be positioned below the bottom surface of the electronic device.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A connection clamp assembly comprising:
   a rigid clamp portion comprising one or more protrusions configured to mechanically secure one or more electrical leads of an electronic device to one or more electrical connection points on a printed circuit board assembly forming an electrical connection;
   one or more fasteners passing through the rigid clamp portion, the fasteners configured to couple the connection clamp assembly to the printed circuit board assembly; and
   a lid elastic element received by the rigid clamp portion, the lid elastic element configured to elastically press on the electronic device, mechanically and thermally coupling the electronic device to the printed circuit board assembly.

2. The connection clamp assembly of claim 1, wherein the electrical connection is solder-free.

3. The connection clamp assembly of claim 1, further comprising:
   one or more baseplate electrical connectors configured to electrically couple a baseplate of the electronic device to the one or more electrical connection points of the printed circuit board assembly; and
   one or more baseplate elastic elements received by the rigid clamp portion configured to elastically press on the baseplate electrical connectors, mechanically securing the baseplate electrical connectors to both the baseplate and the one or more electrical connection points.

4. The connection clamp assembly of claim 1, wherein the rigid clamp portion comprises one or more hard stops configured to interface with the printed circuit board assembly and align the rigid clamp portion.

5. The connection clamp assembly of claim 1, wherein the fasteners pass through perimeter holes of the rigid clamp portion, and the connection clamp assembly is configured to align with a cooling path associated with a cooling system of the printed circuit board assembly.

6. The connection clamp assembly of claim 1, wherein the electronic device is a packaged MOSFET.

7. A connection clamp assembly comprising:
   a rigid clamp portion comprising one or more protrusions configured to mechanically secure one or more electrical leads of an electronic device to one or more electrical connection points on a printed circuit board assembly forming an electrical connection;
   one or more fasteners passing through the rigid clamp portion, the fasteners configured to couple the connection clamp assembly to the printed circuit board assembly; and means for mechanically and thermally coupling the electronic device to the printed circuit board assembly, wherein the means for mechanically and thermally coupling comprises a lid elastic element received by the rigid clamp portion, the lid elastic element configured to elastically press on the electronic device.

8. The connection clamp assembly of claim 7, wherein the electrical connection is solder-free.

9. The connection clamp assembly of claim 7, further comprising:
   means for electrically coupling a baseplate of the electronic device to the one or more electrical connection points of the printed circuit board assembly.

10. The connection clamp assembly of claim 9, wherein the means for electrically coupling includes:
   one or more baseplate electrical connectors configured to electrically couple the baseplate of the electronic device to the one or more electrical connection points of the printed circuit board assembly; and
   one or more baseplate elastic elements received by the rigid clamp portion configured to elastically press on the baseplate electrical connectors, mechanically securing the baseplate electrical connectors to both the baseplate and the one or more electrical connection points.

11. The connection clamp assembly of claim 7, wherein the rigid clamp portion comprises one or more hard stops configured to interface with the printed circuit board assembly and align the rigid clamp portion.

12. The connection clamp assembly of claim 7, wherein the fasteners pass through perimeter holes of the rigid clamp portion, and the connection clamp assembly is configured to align with a cooling path associated with a cooling system of the printed circuit board assembly.

13. The connection clamp assembly of claim 7, wherein the electronic device is a packaged MOSFET.

14. An electronic system comprising:
   a printed circuit board assembly;
   an electronic device configured to be mechanically, electrically, and thermally coupled to the printed circuit board assembly; and
   a connection clamp assembly comprising:
      a rigid clamp portion comprising one or more protrusions configured to mechanically secure one or more electrical leads of the electronic device to one or more electrical connection points on the printed circuit board assembly forming an electrical connection;
      one or more fasteners passing through the rigid clamp portion, the fasteners configured to couple the connection clamp assembly to the printed circuit board assembly; and
      a lid elastic element received by the rigid clamp portion, the lid elastic element configured to elastically press on the electronic device, mechanically and thermally coupling the electronic device to the printed circuit board assembly.

15. The electronic system of claim 14, wherein the electrical connection is solder-free.

16. The electronic system of claim 14, wherein the connection clamp assembly further comprises:
   one or more baseplate electrical connectors configured to electrically couple a baseplate of the electronic device to the one or more electrical connection points of the printed circuit board assembly; and
   one or more baseplate elastic elements received by the rigid clamp portion configured to elastically press on the baseplate electrical connectors, mechanically securing the baseplate electrical connectors to both the baseplate and the one or more electrical connection points.

17. The electronic system of claim 14, wherein the rigid clamp portion comprises one or more hard stops configured to interface with the printed circuit board assembly and align the rigid clamp portion.

18. The electronic system of claim 14, wherein the fasteners pass through perimeter holes of the rigid clamp portion, and the connection clamp assembly is configured to align with a cooling path associated with a cooling system of the printed circuit board assembly.

* * * * *